United States Patent [19]

Kitanishi et al.

[11] 3,948,666
[45] Apr. 6, 1976

[54] SUPPORT FOR LIQUID PHOTOSENSITIVE RESIN

[75] Inventors: Yasuhisa Kitanishi; Hikoichiro Yamada, both of Hino, Japan

[73] Assignee: Teijin Limited, Osaka, Japan

[22] Filed: Apr. 4, 1974

[21] Appl. No.: 457,893

[30] Foreign Application Priority Data
Apr. 13, 1973  Japan.............................. 48-41352
May 2, 1973  Japan.............................. 48-48411

[52] U.S. Cl................ 96/115 P; 96/87 R; 101/395; 427/53; 428/424; 204/159.19; 204/159.15; 260/75 NK
[51] Int. Cl.²......................................... G03C 1/68
[58] Field of Search.............. 117/138.8 F, 161 KP; 96/67, 69, 87 R, 115 P; 101/395; 428/424; 427/53; 204/159.19, 159.15

[56] References Cited

UNITED STATES PATENTS

| | | | |
|---|---|---|---|
| 3,241,973 | 3/1966 | Thommes | 96/67 X |
| 3,287,152 | 11/1966 | Alles et al. | 117/161 KP |
| 3,804,810 | 4/1974 | Fryd | 117/161 KP |

*Primary Examiner*—Ralph S. Kendall
*Assistant Examiner*—John D. Smith
*Attorney, Agent, or Firm*—Sherman & Shalloway

[57] ABSTRACT

A support for use in preparing a printing plate using a liquid photosensitive resin. The support includes a flexible self-supporting base plate and an adhesive layer thereon for applying a layer of a photosensitive resin. The adhesive layer is a layer of a cross-linked polyester-polyurethane resin formed by reacting (A) a linear polyester-polyurethane resin with (B) a polyfunctional isocyanate on the surface of the base plate.

16 Claims, No Drawings

SUPPORT FOR LIQUID PHOTOSENSITIVE RESIN

This invention relates to a flexible support for use in preparing a printing plate consisting of the support and a layer of a liquid photosensitive resin applied in situ to the support and solidified upon exposure, especially to a support including an adhesive layer for firmly bonding the solidified photosensitive resin layer to the support.

A method has previously been known which comprises applying a layer of a solid or liquid photosensitive resin to the surface of an iron plate, aluminum plate or resin sheet through an adhesive layer and an antihalation layer, exposing the photosensitive resin layer to actinic light such as ultraviolet rays through an image-bearing film to solidify the image areas in relief, and washing out the uncured portion with a developer solution, thereby to prepare a relief printing plate having superior properties. Where the photopolymerizable photosensitive resin layer in the unexposed state is a solid which is completely devoid of flowability at room temperature, the manufacturers consume sufficient time to bond the unexposed photosensitive resin layer firmly to the base plate, and sell the resulting plate-making material as merchandise. Thus, it is not so difficult to obtain an adhesive layer which adheres sufficiently firmly to the base. However, when the photopolymerizable photosensitive resin layer is a liquid resin composition having flowability at room temperature, it is the practice to cast the resin liquid on a separately prepared base plate immediately before plate making, and then immediately exposing it to light to adhere reliefs of all shapes forming the image area firmly to the base plate. Thus, many problems to be solved exist as regards the adhesive layer when using liquid photosensitive resins.

Above all, when a polyethylene terephthalate film having low adhesive strength is used, there is a problem of not only the adhesion between the photosensitive resin layer and the adhesive layer, but also the poor adhesion between the adhesive layer and the base plate. The adhesive layer must primarily satisfy all the following requirements.

1. It should be moderately attacked at its surface by the liquid photosensitive resin in contact with it.
2. It should have flexibility so that it can maintain adhesive strength sufficiently endurable to heavy mechanical stress during the handling of the printing plate.
3. It should have sufficient resistance to chemicals such as the developer solution or ink washing liquids.
4. It should be free from any unnecessary tackiness on the surface.

In order to improve the chemical resistance of the adhesive layer, there has already been proposed a technique whereby a cross-linked partially hardened barrier layer is provided between the adhesive layer and the photosensitive resin layer (Japanese Pat. Nos. 23761/61 and 12104/65) the latter corresponding to U.S. Pat. No. 3,287,152 to Alles et al. This technique is intended to prevent the reduction of the adhesive strength of the adhesive layer which occurs as a result of the attacking of the contact surface between the photosensitive resin layer and image relief areas by a developing solution when washing out the uncured portion of the photosensitive resin. This method, however, is economically disadvantageous because control of the conditions for coating a barrier layer forming composition on the adhesive layer is difficult and the barrier layer must be partially hardened which is also a troublesome procedure. Furthermore, the polymerization reaction taking place during the formation of the barrier layer renders the thin base plate unsatisfactorily warped, and frequently causes marked disadvantages in the subsequent operations.

Attempts have also been made to use various resins considered to be relatively well bonded to the surface of a base plate which permits difficult bonding, such as polyethylene terephthalate, for example, copolyester resins such as copolyesters derived from ethylene glycol, terephthalic acid and isophthalic acid, resorcinol-formaldehyde resins, and vinyl copolymers such as vinylidene chloride-type copolymers disclosed in U.S. Pat. No. 2,762,720 and Belgian Pat. No. 655,644. But none of these attempts have ever proved satisfactory, and suffer from one or more defects. For example, high temperatures and long periods of time for curing are required, or the adhesive layer has poor chemical resistance, or the adhesive layer has poor affinity for, and swellability with, the liquid photosensitive resin, or has poor flexibility. Because of these defects, the resulting adhesive layers are scarcely feasible.

Accordingly, an object of this invention is to provide a support for a liquid photosensitive resin, which is free from the various defects of the prior techniques described above, is cheap, has superior properties, lends itself to easy handling, and can be used for making a printing plate in situ.

Another object of this invention is to provide a support for a liquid photosensitive resin having an adhesive layer thereon for bonding a layer of the photosensitive resin firmly thereto.

These objects of this invention can be achieved by a support for use in preparing a printing plate using a liquid photosensitive resin, comprising a flexible self-supporting base plate and an adhesive layer thereon for applying a layer of a photosensitive resin, said adhesive layer being a layer of a cross-linked polyester-polyurethane resin formed by reacting (A) a linear polyester-polyurethane resin with (B) a polyfunctional isocyanate on the surface of the above base plate.

Preferably, the flexible base plate used in this invention is a base plate composed of a thin transparent substance. For example, a film of a polyester such as poly(ethylene 2,6-naphthalate) or polyethylene terephthalate, a polycarbonate film, a film of a cellulose, a film of a polyolefin such as polyethylene or polypropylene, a polyamide film, and a polyvinyl chloride film can all be used. Of these, the polyethylene terephthalate film which has dimensional stability and is tough against mechanical breaking power such as tear is especially preferred.

In order to increase the adhesive strength between the base plate and the adhesive layer, the surface of the base plate can be subjected to various pre-treatments. For example, the surface may be sanded to form a mat surface. Or the surface can be activated with an oxidizing strong acid, or by corona discharge or ioninzing radiation. Furthermore, the surface may be coated with a thin layer of a titanic acid ester, or may be chemically roughened using a solvent.

As the base plate, a film of the transparent resin as exemplified above is suitably used, but a non-transparent plate can also be used. For example, a thin sheet of a metal such as zinc, aluminum or steel, a rubber sheet, paper, or a non-woven fabric can be used.

The adhesive layer is applied as a layer of a moderately cross-linked polyester-polyurethane resin. Specifically, a hydroxyl-terminated bifunctional polyester resin is reacted with a diisocyanate to form a high-molecular-weight linear polyester-polyurethane resin, and the polyester-polyurethane resin is reacted with a polyfunctional isocyanate on the surface of the base plate to cross-link it and simultaneously bond it firmly to the base plate.

The linear polyester-polyurethane is obtained by reacting a linear polyester resin substantially having a hydroxyl group at both ends with a bifunctional isocyanate compound. Examples of preferred polyester resins are aliphatic linear polyesters, for example, polyesters derived from dibasic organic carboxylic acids as a dicarboxylic acid component, such as adipic acid, maleic acid or dimeric acid and glycols as a glycol component such as ethylene glycol, propylene glycol, trimethylene glycol, tetramethylene glycol, or diethylene glycol, and polycaprolactone. Linear polyesters containing an aromatic portion obtained by replacing a part of the dibasic organic carboxylic acid by phthalic acid can also be used. The polyester may include an amide group or ether group inert to the isocyanate group, in its chain. Preferably, the polyesters should have an average molecular weight of 500 to 6,000, especially 800 to 3,000.

The polyester portion incorporated in the chain of the linear polyester-polyurethane chain forms a soft segment portion. The soft segment portion permits the moderate permeation of the liquid photosensitive resin, and plays the most important role in the present invention. If the molecular weight of the polyester is too low, there tends to be obtained a hard adhesive layer as a result of excessive intermolecular bonding. On the other hand, if it is too high, there tends to be obtained a tacky film having inferior durability.

Examples of the bifunctional isocyanate compound are 2,4-tolylene diisocyanate (TDI for short), diphenylmethane diisocyanate (MDI for short), para-phenylene diisocyanate, 2-chloro-1,4-phenyl diisocyanate, 1,5-naphthalene diisocyanate, 3,3'-dimethyl-4,4'-diphenyl diisocyanate, 3,3'-dimethyl-4,4'-diphenylmethane diisocyanate, hexamethylene diisocyanate, and xylylene diisocyanate.

Preferably, the linear polyester-polyurethane resin obtained by reacting the polyester with the bifunctional isocyanate usually has a number average molecular weight of 10,000 to 100,000, especially 20,000 to 50,000. The terminal groups of the linear polyester-polyurethane resin may be hydroxyl groups, isocyanate groups, or other organic groups inert to the isocyanate groups.

Preferably, the polyester-polyurethane resin has a hydroxyl value of not more than 20, more preferably not more than 5.

Polyester-polyurethane resins most suitably used are those having an average molecular weight of about 20,000 to 50,000 which are obtainable by chain-extending a polyester derived from a dicarboxylic acid component composed mainly of adipic acid and a glycol component composed mainly of 1,4-butanediol or ethylene glycol, with TDI or a mixture of TDI and MDI.

Examples of suitable polyfunctional isocyanates that can be used in this invention are an adduct formed between trimethylol propane and TDI (for example, Desmodur L-75, the tradename for the product of Bayer AG), an adduct formed between trimethylol propane and xylylene diisocyanate, and condensates of diisocyanates such as Desmodur IL, Desmodure CT, a trimer of TDI, or Desmodur N. The bifunctional isocyanates useful for chain-extending the linear polyesters to form the polyester-polyurethane resins can also be used as the polyfunctional isocyanates.

The amount of the polyfunctional isocyanate is usually 5 to 30% by weight, preferably 5 to 20% by weight, based on the total amounts of the linear polyester-polyurethane resin and the polyfunctional isocyanate, although the amount varies according to the structure of the polyfunctional isocyanate.

According to this invention, the above-described linear polyester-polyurethane resin is reacted with the polyfunctional isocyanate on the surface of the base plate, thereby to form a cross-linked polyester-polyurethane resin layer on the surface.

The above reaction can also be carried out in the presence of an additional component which is a nongaseous compound having a photopolymerizable ethylenic double bond in the molecule. Examples of the compound having a photopolymerizable ethylenic double bond include acrylic or methacrylic acid esters such as 2-ethylhexyl acrylate, lauryl acrylate, cyclohexyl acrylate, 2-hydroxyethyl acrylate, 2-hydroxymethyl methacrylate, 2-hydroxypropyl methacrylate, diethylene glycol diacrylate, polyethylene glycol acrylate, diethylene glycol dimethacrylate, polyethylene glycol dimethacrylate, glycidyl methacrylate, tetrahydrofuryl methacrylate, glycerol monoacrylate, or 3-chloro-2-hydroxypropyl methacrylate; styrene and various styrene derivatives; vinyl esters such as vinyl acetate or vinyl butyrate; amide compounds such as acrylamide, methacrylamide, N-methylol acrylamide, diacetone acrylamide, or N,N'-dialkyl acrylamides; polyfunctional acrylic or methacrylic acid esters such as trimethylol propane triacrylate or methacrylate, trimethylol propane diacrylate or dimethacrylate, trimethylol propane triacrylate or trimethacrylate, pentaerythritol tetraacrylate or tetramethacrylate, or pentaerythritol triacrylate or trimethacrylate; allyl monomers such as diallyl phthalate (or its prepolymer), triallyl cyanurate or triallyl isocyanurate; and various high-molecular-weight photopolymerizable compounds having a plurality of vinyl groups at the ends of the molecule or at the side chains. Of these compounds, those having a boiling point of at least 100°C. at atmospheric pressure are preferred, and those having at least 2 ethylenic carbon-to-carbon double bonds in the molecule are more preferred. Furthermore, the compounds having a photopolymerizable ethylenic double bond can more suitably be used when they contain active hydrogen capable of reacting with isocyanate groups.

While we do not intend to limit the present invention by any theory, we assume that the compounds having active hydrogen capable of reacting with isocyanate groups especially give adhesive layers of improved bond strength because these compounds also react at the time of reacting the polyester-polyurethane resin with the polyfunctional isocyanate and are present in the adhesive layer in the chemically bound state. Of such compounds, polyfunctional vinyl compounds having a hydroxyl group in the molecule are especially preferred for their moderate reactivity.

The amount of the compound having a photopolymerizable ethylenic double bond is usually 1 to 50% by weight, preferably 3 to 30% by weight, based on the polyester-polyurethane resin.

Furthermore, a catalyst for promoting the cross-linking reaction, a stablizer, or a plasticizer such as benzylbutyl phthalate can also be added to the reaction components. The adhesive layer can be given an antihalation effect by adding a dye or pigment which absorbs actinic light.

The reaction of the linear polyester-polyurethane and the polyfunctional isocyanate and if desired, the compound having a photopolymerizable ethylenic carbon-to-carbon double bond can be conveniently carried out by coating a solution of these components on the surface of the support to form the desired adhesive layer.

The linear polyester-polyurethane resin is applied as a solution uniformly dissolved in a solvent inert to isocyanate groups, such as an acetic acid ester, toluene, benzene, xylene, dichloroethane, methyl ethyl ketone, or dimethyl formamide, and in this case, the polyfunctional isocyanate and possibly the compound having a photopolymerizable ethylenic double bond are simultaneously mixed, and applied.

The adhesive layer coated on the base plate is usually dried by hot air to remove the solvent. The thickness of the layer is desirably at least one micron, especially suitably 5 to 20 microns. The hot air drying is performed immediately after coating, for 1 to 2 minutes at 100° to 150°C. The conditions are of course varied according to the solvent used. In any case, this heating step is to be understood as a step of merely removing the solvent.

The reaction of isocyanate groups with active hydrogen atoms of the trunk polymer and possibly, the compound having active hydrogen in the molecule and a photopolymerizable ethylenic double bond, and the reaction of the isocyanate groups with the surface of the base plate proceed effectively and rapidly even at room temperature after drying, and upon complete disappearance of the isocyanate groups, a sufficiently cross-linked adhesive layer firmly adhered to the base plate is formed.

Since the trunk polymer in the adhesive layer is polyurethane having a high degree of polymerization, no undesirable tackiness of the adhesive layer exists even when the crosslinking still does not proceed. Therefore, the adhesive layer does not suffer from a blocking phenomenon whereby the coated surface intimately adheres to other surfaces of the base sheet.

As is clear from the above description, the method of forming the adhesive layer in accordance with this invention differs from the method of forming a coating of Desmophen-Desmodur (D—D lacquer) which has been widely accepted as a polyurethane lacquer. In the case of the D—D lacquer, a polyester resin itself containing a hydroxyl group is mixed with a polyfunctional isocyanate, and chain-extension is performed in situ and simultaneously, cross-linking is performed to a great extent. Thus, unless heat curing is performed for sufficiently long periods of time after coating, the adhesive strength between the coated film and the base plate is insufficient. Furthermore, the filmy base plate is frequently warped miserably as a result of shrinkage due to the polymerization of the adhesive layer, and because of the excessive cross-linkage, the adhesive strength between the adhesive layer and the photosensitive resin is low. It has also been found that when the polyester resin used is based on an aromatic dicarboxylic acid, the adhesive strength of the adhesive layer is extremely poor because of the crystallinity of the molecular chain and the high hardness of the coated film.

The liquid photosensitive resin to be applied to the adhesive layer on the support of this invention to form a printing plate in situ is a mixture of a polymerization initiator capable of being easily activated by actinitic light and a composition consisting mainly of a compound having a polymerizable or cross-linking ethylenic carbon-to-carbon double bond.

This photosensitive resin is generally applied to the adhesive layer as a uniform layer having a thickness of 0.2 to 10 mm. Examples of suitable liquid photosensitive resins are those consisting of polymers such as a vinyl chloride copolymer, an acrylic ester copolymer, a polyvinyl alcohol derivative, a cellulose derivative (e.g., cellulose ether), a polyamide, polyurethane, or a polyester, especially an unsaturated polyester having an unsaturated bond in the molecule, and a liquid photopolymerizable monomer consisting of acrylic acid, methacrylic acid, a derivative of any of these such as an ester or amide, styrene, a styrene derivative, or a vinyl ester, or a mixture of at least two of these. The support of this invention is especially suitable for application of a liquid photosensitive resin composed of a mixture of an unsaturated polyester having at least one carbon-to-carbon double bond inert to actinic light in the molecular chain, and a liquid or solid addition-polymerizable monomer of various kinds. The good affinity of such a photosensitive resin for the adhesive layer is combined with its moderate anchoring effect, and reliefs after exposure and development exhibit strong adhesion to the adhesive layer.

Usually, the liquid photosensitive resin contains a photopolymerization initiator such as diacetyl, benzyl, benzoin or benzoin alkyl ethers, anthraquinone, Eosine, Thionine, or thiol.

Sometimes, the liquid photosensitive resin is coated on the support after being given flowability using a solvent. However, if the solvent cannot be a constituent of image areas solidifed as a result of exposure of actinic light, the solvent cannot be used in a great quantity as a matter of course.

Plate making is carried out by exposing the platemaking material imagewise to actinic light. Examples of the light sources for actinic light are a tungsten-filament lamp, a fluorescent lamp, a carbon arc lamp, a mercury lamp, or Xenon lamp. It is chosen according to the properties of the photosensitive resin. Usually, light sources emitting actinic lignt including ultraviolet rays are used.

It is desirable that at the time of exposure, the platemaking material composed of the photosensitive resin layer, the adhesive layer and the support should be maintained at an elevated temperature of about 20°C. to 70°C. Immediately after exposure, the uncured portion is washed out with a developer solution. Under ordinary conditions, the adhesive layer formed in accordance with this invention is quite stable to the developer solution such as an alkaline aqueous solution. Accordingly, the reduction of the adhesive strength of the image areas after development is not observed at all.

The photosensitive resin plate obtained by using the support of this invention can be produced at low cost and with good efficiency, and the printing plate produced from it exhibits sufficient resistance to external mechanical forces and can endure use over prolonged periods of time during printing or handling after printing because it includes the flexible base plate and the stretchable adhesive layer.

The following Examples and Comparative Examples illustrate the present invention in greater detail. In these examples, all percents and parts are by weight.

EXAMPLE 1 AND COMPARATIVE EXAMPLE 1

A polyester-polyurethane resin having a molecular weight of about 40,000 obtained by chain-extending polyethylene adipate having a hydroxyl group at both ends and having an average molecular weight of 1300 was dissolved in a mixed solvent consisting of ethyl acetate and methyl ethyl ketone to form a 35% solution. This polyester-polyurethane resin had an end blocking agent added to its termini, and had a hydroxyl value of not more than 2. Ten parts of a 75% ethyl acetate solution of an adduct of trimethylol propane and TDI (Coronate L-75, isocyanate group content 13.4%, the product of Nippon Polyurethane Company) was added to 100 parts of the resulting 35% solution. Then, an oil-soluble yellow dye (color index No. 11390) was added to the mixture in an amount of 2% based on the resin content. A solvent was further added to form a solution having a solids content of 15%. The solution was thoroughly stirred in a ball mill until its viscosity became 20 poises. The coating solution was then coated by a bar coater uniformly on the surface of a 0.15 mm thick aluminum plate degreased with trichloroethylene.

Immediately then, the coated base plate was placed in a hot air dryer held at 100°C., and dried for about 2 minutes to drive off the solvent. The coated layer had an average thickness of about 8 microns. At this time, the surface of the coated layer was almost free from tackiness, and could come into contact with other materials without blocking.

When the resulting product was allowed to stand for 5 days in a dry room held at 40°C., the coated layer was sufficiently cross-linked and was hardly swollen with ethyl acetate.

For comparison, 30 parts of Coronate L-75 (the molar ratio of hydroxyl to isocyanate being about 1) was added to 100 parts of a 40% ethyl acetate solution of the same polyethylene adipate as used above (hydroxyl value 87), and 0.2%, based on the resin content, of a tertiary amine catalyst was added to form a coating solution. The solution was coated on the same base plate, and dried under the same conditions. The coating was very tacky, and its handling was extremely inconvenient unless a releasing paper is laminated thereon. When the coating was heated for 40 hours at 80°C., the surface became non-tacky, and cross-linking proceeded sufficiently.

A semi-transparent liquid photosensitive composition consisting of 35 parts of methyl cellulose, 65 parts of triethylene glycol diacrylate, 3 parts of anthraquinone, and 0.03 part of hydroquinone was uniformly coated on each of the two plates obtained above to a thickness of 0.7 mm. Immediately then, the plate obtained was exposed to ultraviolet rays through a negative film adhered intimately to the photosensitive resin layer via a 12 micron thick polypropylene sheet. At this time, the temperature of the surface of the film was 35°C.

Those portions of the resin layer which were not polymerized by exposure were washed out with water to prepare a printing plate. Furthermore, the printing plate was sufficiently exposed to solidify the reliefs completely. The solidified portions were in the form of a square having each side measuring 10 mm and a height of 0.7 mm and a rectangle having a size of 10 mm × 20 mm. The test pieces obtained were each wound around a cylinder having a radius of curvature of 45, 20, 16, 12, 9, and 6.5 mm respectively at 20°C., and the state of separation of the relief portions was observed. The minimum radius with which the separation occurred is shown in Table 1 for each of the test pieces.

Table 1

| | Relief (10 × 10 mm) | Relief (10 × 20 mm) |
|---|---|---|
| Example | 9 mm | 16 mm |
| Comparative Example 1 | 16 mm | 45 mm |

In the comparison, separation occurred between the adhesive layer and the resin layer, and the printing plate could not be used.

EXAMPLE 2 AND COMPARATIVE EXAMPLE 2

Polybutylene adipate having a molecular weight of 1500 was chain-extended with TDI, and the chain was terminated with monoalcohol to form polyester-polyurethane having a molecular weight of about 20,000 and a hydroxyl value of about 1. To a solution of 50 parts of the polyester-polyurethane in 350 parts of ethyl acetate were added 8.5 parts of Coronate L-75, and 3 parts of the same yellow dye as used in Example 1, and the mixture was thoroughly stirred.

On the other hand, for comparison, 100 parts of a commercially available copolyester resin (Vylon No. 300, Toyo Spinning Company, a highly polymerized saturated polyester having a hydroxyl value of 7 and prepared from terephthalic acid, sebacic acid and ethylene glycol), 50 parts of a vinyl chloride/vinyl acetate copolymer (Vinylite VYHH, vinyl acetate content 13%, Union Carbide Corporation), 10 parts of Coronate L-75, 5 parts of an organic yellow pigment and 400 parts of a mixed solvent consisting of methyl ethyl ketone and toluene were thoroughly mixed.

A biaxially oriented polyethylene terephthalate film having a thickness of 125 microns was prepared, and each of the adhesive solutions prepared above was coated on it, and immediately, dried with hot air at 120°C. for 1 minutes to drive off the solvent. The amount of coating was about 10 gr/m$^2$ in each case. At this time, the surface of the coated film was non-tacky. When the coated film was allowed to stand for several days in a dry room held at 20°C., the cross-linking of the adhesive layer proceeded, and the cross-linked layer could not be dissolved in solvent.

A photosensitive resin was prepared from 57 parts of a polyester (prepared by using 8 mols of fumaric acid, 2 mols of trimellitic acid anhydride and 9 mols of diethylene glycol) 6 parts of acrylamide, 20 parts of tetraethylene glycol dimethacrylate, 16 parts of nonaethylene glycol dimethacrylate, 1 part of benzoin methyl ether and 0.01 part of hydroquinone.

The resulting photosensitive resin solution was coated to a thickness of 0.7 mm on each of the films coated with the adhesive layer. A thin polyester cover film and a negative film were superimposed on the surface of the resulting resin layer, and the plate was exposed for 5 minutes through the negative film maintained at 60°C., using a 450 W high pressure mercury lamp. After exposure, the uncured portions were washed out with a 0.5% aqueous solution of sodium carbonate, and the plate was then further exposed to solidify the reliefs completely.

The resulting printing plates were subjected to the same separation test as in Example 1, and the results obtained are shown in Table 2.

Table 2

|  | Relief 10 × 10 mm | Relief 10 × 20 mm |
|---|---|---|
| Example 2 | 6.5 mm | 16 mm |
| Comparative Example 2 | 20 to 45 mm | more than 45 mm |

Separation, mostly between the base film and the adhesive layer, occurred very simply in the printing plate obtained in the comparison, and the separation.

EXAMPLE 3 AND COMPARATIVE EXAMPLE 3

A liquid photosensitive resin composition was prepared from 30 parts of a methyl methacrylate/methacrylic acid (70:30), 30 parts of triethylene glycol diacrylate, 30 parts of trimethylol propane trimethacrylate, 10 parts of polyethylene glycol having a molecular weight of 100,000 and 2 parts of benzoin ethyl ether. The composition was uniformly coated on each of the same base plates having the adhesive layers as prepared in Example 2 and Comparative Example 2 to a thickness of 0.5 mm, and the plate was exposed imagewise for 5 minutes in the same way as in Example 2. Then, the unexposed portions were washed out with a 1% aqueous solution of sodium hydroxide at 40°C.

In the comparison, the small halftone-dot reliefs separated from the base plate during 3 minutes' washing, and the plate could not be used.

In the plate obtained in the example, relief images could be reproduced in perfect condition, and after post-exposure, the printing plate could endure printing of 200,000 copies.

EXAMPLE 4 AND COMPARATIVE EXAMPLE 4

Polycaprolactone (PANDEX M-103ES, the tradename for the product of Dainippon Ink and Chemicals, Inc.) having an average molecular weight of 2000 and having a hydroxyl group at both ends was chainextended with a mixture of TDI and MDT (1:1 mol ratio) to form polyester-polyurethane having an average molecular weight of 20,000. 50 parts of the resulting polyester-polyurethane, 10 parts of a 75% ethyl acetate solution of an addition product of trimethylol propane and xylylene diisocyanate (TAKENATE D-110-N, the tradename for the product of Takeda Pharmaceutical Co., Ltd.), 0.1 part of triethylene diamine, 3 parts of a yellow pigment, and 300 parts of a mixed solvent consisting of methyl ethyl ketone and toluene were mixed to form an adhesive solution. The resulting adhesive solution was coated on a polyethylene terephthalate film having a thickness of 100 microns.

For comparison, 50 parts of Desmophen-800 (a polyhydroxy compound having a hydroxyl value of 290 and prepared from adipic acid, phthalic acid, triol), 20 parts of Desmophen 1700 (polyhydroxy polyester having a hydroxyl value of 40), 70 parts of Coronate L-75, 5 parts of a yellow pigment, and 300 parts of a mixed solvent consisting of ethylene glycol acetate, butyl acetate, ethyl acetate and toluene were well mixed to form a polyurethane coating solution.

The resulting solution was coated on the same base film as used above to a thickness of about 10 microns using a bar coater.

Immediately, each of the coated base films was dried for 2 minutes at 120°C. to drive off the solvent, and by a customary method, curing was further performed at 50°C. for several days. The adhesive layers were cross-linked, and could not be redissolved in solvent. However, the film used in the comparison was markedly warped, and lent itself to troublesome handling.

Using the same unsaturated polyester-type photosensitive resin as used in Example 2, the same relief images as in Example 2 were formed on each of the films obtained, and the resulting printing plates were subjected to the same separation test as in Example 1. The results obtained were substantially the same as those shown in Table 1.

EXAMPLE 5 AND COMPARATIVE EXAMPLE 5

Polybutylene adipate having an average molecular weight of 1,500 and a hydroxyl group at both ends was chainextended with IDI to form a polyester-polyurethane resin having a molecular weight of about 40,000 and a hydroxyl value of less than 1. The resin was dissolved in a mixed solvent consisting of ethyl acetate and methyl ethyl ketone to form a 35% solution. 100 parts of the resulting 35% solution, 8 parts of 2-hydroxyethyl methacrylate, 2%, based on the resin content, of an oil-soluble yellow dye (color index 11390), and a solvent were mixed in a ball mill. Finally, 10 parts of a 75% ethyl acetate solution of an adduct of trimethylol propane and TDI (Coronate L-75, isocyanate content 13.4%, the product of Nippon Polyurethane Co., Ltd.) was added. When the viscosity of the resulting solution became 20 poises, the solution was coated uniformly on a biaxially oriented polyethylene terephthalate film having a thickness of 0.125 mm using a bar coater. Immediately then, the coated film was dried for about 2 minutes in a hot air dryer at 100°C. to drive off the solvent. The coated layer had a thickness of about 10 microns. At this time, the surface of the adhesive layer was almost non-tacky, and could be freely contacted with other substances without blocking. When the coated film was allowed to stand for 3 days in a dry room held at 20°C., the coated layer was sufficiently cross-linked, and it was found that the cross-linked layer was scarcely swollen with ethyl acetate.

For comparison, a base plate with an adhesive layer was prepared in the same way as above except that 2-hydroxyethyl methacrylate was not used, and the amount of the Coronate L-75 was reduced to 7 parts. The adhesive layer of the comparison plate was also in the sufficiently cross-linked state.

A photosensitive resin composition as used in Example 2 was coated on each of the above base plates containing adhesive layers, to a thickness of 0.7 mm. A thin polyester cover film and a negative film were superimposed on the surface of the resulting resin layer, and the plate was exposed for 5 minutes through the negative film maintained at 60°C., using a 450 W high pressure mercury lamp. After exposure, the uncured portions were washed out with a 0.5% aqueous solution of sodium carbonate, and then, the plate was post-exposed for another 5 minutes to solidify the reliefs completely. The solidified reliefs were of a rectangular shape having a size of 10 mm × 20 mm, and of a line-relief having a width of 0.06 mm.

The resulting printing plates were wound around a cylinder having a radius of curvature of 4 mm, 6.5 mm, 9 mm, 12 mm, and 16 mm respectively, and the state of separation of the relief portion was observed. The minimum radius with which the separation occurred in each of the plates is shown in Table 3.

Table 3

|  | Relief 10 × 20 mm | Relief 0.06 mm |
|---|---|---|
| Example 5 | 12 mm | 6.5 mm |
| Comparative Example 5 | 16 | 9 mm |

Separation occurred over a substantial portion between the adhesive layer and the resin layer in the line-reliefs of the comparison plate, but in the example, the separation was only partial.

EXAMPLE 6 AND COMPARATIVE EXAMPLE 6

A photosensitive resin solution was prepared from 30 parts of a methyl methacrylate/methacrylic acid copolymer (70:30), 30 parts of triethylene glycol diacrylate, 30 parts of trimethylol propane methacrylate, 10 parts of polyethylene glycol having a molecular weight of 100,000, 2 parts of benzoin ethyl ether and 0.03 part of methoxyhydroquinone. The solution was unfiromly coated to a thickness of 0.5 mm on each of the same base plates having adhesive layers as used in Example 5 and Comparative Example 5. The coated plate was exposed imagewise for 5 minutes in the same way as in Example 5, and the unexposed areas were washed out with a 0.3% aqueous solution of sodium hydroxide at 40°C.

In the comparison, the line-reliefs having a size of 0.06 mm were somewhat separated, and were completely removed by a washing operation using a washing oil which was performed during printing. On the other hand, the printing plate obtained in the example could withstand printing of 300,000 copies.

EXAMPLE 7 AND COMPARATIVE EXAMPLE 7

Polyethylene butylene adipate having a molecular weight of 2,000 was chain-extended with a mixture of equal amounts of TDI and MDT, and the chain was blocked with monoalcohol to form polyester-polyurethane having a molecular weight of about 20,000 and a hydroxyl value of about 2. 100 parts of a 35% ethyl acetate solution of this resin was mixed with 5 parts of pentaerythritol trimethacrylate and 4 parts of an organic yellow pigment. The mixture was diluted with ethyl acetate, and completely stirred in a ball mill. Furthermore, 10 parts of Coronate L was added, and the mixture was diluted with ethyl acetate to form a 15% solution.

For comparison, an adhesive solution was prepared from 100 parts of a commercially available copolyester resin (Vylon No. 300 of Toyo Spinning Co., Ltd., a highly polymerized saturated polyester resin having a hydroxyl value of 7 and prepared from terephthalic acid, isophthalic acid, sebacic acid and ethylene glycol), 50 parts of a vinyl chloride/vinyl acetate copolymer (Vinylite VYHH, vinyl acetate content 13%, the product of Union Carbide Corporation), 15 parts of Coronate L-75, 7 parts of pentaerythritol trimethacrylate, some amount of an organic yellow pigment, and 400 parts of a mixed solvent consisting of methyl ethyl ketone and toluene.

Each of the above adhesive solutions was coated on a 100 μ thick polyethylene terephthalate film using a bar coater, and then dried for 2 minutes with hot air at 120°C. to drive off the solvent. The thickness of the coating was about 8 microns. At this time, the surface of the coated layer was non-tacky. When it was cured for several days at 40°C., the adhesive layer was cross-linked, and the cross-linked layer could not be re-dissolved in solvent.

Relief images were obtained in the same way as in Example 5 using the same unsaturated polyester-type photosensitive resin.

In the comparison, the line-reliefs having a width of 0.06 was separated during the 3-minute development procedure, and rectangular relief images of 10 × 20 mm were separated from the base film by a slight curving with a radius of curvature of more than 45 mm.

On the other hand, in the example, the line-reliefs of 0.06 mm was completely bonded to the adhesive layer, and the printing plate could endure printing of more than 300,000 copies in a printing test using a small-sized relief printing press.

COMPARATIVE EXAMPLE 8

The same adhesive composition as used in Comparative Example 7 was coated to a thickness of 5 microns on a polyethylene terephthalate film having a thickness of 100 microns, and cured for 10 minutes at 80°C. Furthermore, it was allowed to stand for several days at room temperature, and then a top coating solution was applied to it. The top coating solution was prepared by dissolving a composition consisting of 100 parts of the same polyester-polyurethane resin as used in Example 5, 50 parts of a 1:1 mixture of pentaerythritol tetraacrylate and pentaerythritol triacrylate, 25 parts of Coronate L and 2 parts of bonzoyl peroxide in a mixed solvent consisting of ethyl acetate and toluene. The coated layer had a thickness of about 5 microns. The coated layer was cured at 100°C. and 120°C. for about 5 minutes and at 130°C. for 2 minutes.

The top coat changed to an almost non-tacky state, but warping of the film occurred with the coated surface being inside. In addition, wavy corrugations occurred at random at many places of the film, and the resulting coated film could not be used.

COMPARATIVE EXAMPLE 9

Polyethylene butylene adipate having a molecular weight of 1600 (ODX-451, tradename for the product of Dainippon Ink Chemicals, Inc., hydroxyl value 72.5, both ends being hydroxyl groups) was completely dehydrated, and reacted with stirring with 2 molar times of toluylene diisocyanate which had been purified by distillation, at 100°C. for 3 hours. After the terminal hydroxyl groups were completely reacted, the product was cooled, and dissolved in a suitable amount of dimethyl formamide. The prepolymer solution was added dropwise with vigorous stirring to a dimethyl formamide solution of β-alanine hydrazide ($NH_2 \cdot CH_2 \cdot CH_2 \cdot CONHNH_2$). The viscosity increased gradually, and finally, a polyester-polyurethaneurea solution having a viscosity of 800 poises and a solids concentration of 30% was formed. After stabilizing the remaining isocyanate groups completely with diethyl amine, 100 parts of the polyester-polyurethaneurea resin solution was mixed with 10 parts of Coronate L-75 and 3 parts of Hansa Yellow. The resulting solution was diluted with ethyl acetate to a concentration of 10%.

The resulting solution was coated on a uniform polyethylene terephthalate film having a thickness of 125 microns using a bar coater. The thickness of the coating was 5 microns. Then, the coated film was dried with hot air to drive off the solvent completely. At this time, the surface of the coating was almost non-tacky. Then, the coated film was cured for about 5 days in an oven at 50°C. The isocyanate groups in the coating were completely consumed, and the coated layer was cross-linked.

The same unsaturated polyester-type liquid photosensitive resin as used in Example 2 was coated on the resulting base plate, and a printing plate was prepared from the coated plate in the same way as in Example 1.

When the resulting printing plate was subjected to a slight stress, the polyurethaneurea adhesive layer was separated from the polyethylene terephthalate base film, and the relief images were easily removed. Thus, the printing plate could not be used for actual printing.

It is seen from this comparison that when a polyester-polyurethaneurea resin is used instead of the polyester-polyurethane resin, a satisfactory adhesive layer cannot be formed.

EXAMPLE 8

An unsaturated polyester liquid photosensitive resin was prepared by mixing 60 parts of an unsaturated polyester (acid value about 100; obtained by condensing 1 mol of trimellitic anhydride, 6 mols of fumaric acid, 3 mols of adipic acid and 9 mols of diethylene glycol at an elevated temperature in a customary manner), 6 parts of methacrylamide, 6 parts of tetraethyleneglycol dimethacrylate, 12 parts of nonaethyleneglycol dimethacrylate, 16 parts of 2-acetoxyethylmethacrylate, 0.7 part of benzoin ethyl ether, and 0.003 part of N-nitrosodiphenylamine.

On the other hand, the same lacquer consisting mainly of polyester-polyurethane resin as used in Example 7 was coated on one sand-blasted surface of a polyethylene terephthalate film having a thickness of 125 microns. The amount of the lacquer coated was about 10 gr/m² calculated as solids content. The solvent was immediately removed off by hot air, and the coated film was heated at 130°C. for about 3 minutes. At this time, the coating was substantially non-tacky. The curing was further continued at 40°C. for about 10 days to complete the cross-linkage.

The resulting base plate was coated with the above photosensitive resin to a thickness of about 0.7 mm, and exposed imagewise for 4 minutes from the distance of about 10 cm using eight 20 W chemical fluorescent lamps. Then, the unexposed areas were washed out with a dilute aqueous solution of sodium carbonate. It was found that the image was faithfully reproduced and adhered strongly to the based plate. In particular, isolated dots having a diameter of 200 microns or fine line-reliefs with a width of 50 microns were also completely bonded to the base plate. The resulting printing plate was subjected to post-exposure for 6 minutes, and dried. The resulting printing plate was mounted on a rotary press using an adhesive tape, and printing was continued at high speed (about 100 m/min.). The plate was in perfect condition even after producing 500,000 printed copies.

What we claim is:

1. A liquid photosensitive resin and support therefore for use in preparing a printing plate using a liquid photosensitive resin which includes a mixture of a polymerization initiator activatable by actinic light and a liquid compound having a polymerizable or cross-linkable ethylenic carbon-to-carbon double bond which comprises a liquid photosensitive resin layer and a support, said support consisting essentially of a flexible self-supporting base plate and an adhesive layer thereon for adhering a layer of said photosensitive resin, said adhesive layer being a layer of a cross-linked polyester-polyurethane resin which is the reaction product of (A) a linear polyester-polyurethane resin obtained by reacting a linear hydroxyl-terminated bifunctional polyester resin with a bifunctional isocyanate compound with (B) a polyfunctional isocyanate on the surface of said base plate, the reaction between (A) and (B) being carried out until isocyanate groups disappear.

2. The support of claim 1 wherein component (A) is a reaction product of a linear hydroxyterminated bifunctional polyester (a) having a molecular weight of about 800 to 3,000 with a diisocyanate (b), said reaction product having a hydroxyl value of not more than about 20.

3. The support of claim 2 wherein said component (A) has a hydroxyl value of not more than about 5.

4. The support of claim 1 wherein said component (A) has a molecular weight of about 20,000 to about 50,000.

5. The support of claim 1 wherein the linear polyester for forming the component (A) is an aliphatic polyester.

6. The support of claim 1 wherein said component (B) is a triisocyanate.

7. The support of claim 1 wherein the amount of said component (B) is 5 to 20% by weight based on the sum of the components (A) and (B).

8. The support of claim 3 wherein said component (C) contains active hydrogen capable of reacting with isocyanate groups.

9. The support of claim 3 wherein said component (C) contains a hydroxyl group in the molecule.

10. The support of claim 1 wherein said liquid photosensitive resin is a mixture of an unsaturated polyester having in molecular chain a carbon-to-carbon double bond inert to actinic light, at least one addition-polymerizable monomer, a photoinitiator and stabilizer.

11. The support of claim 2 wherein said polyester (a) is the reaction product of a dibasic organic carboxylic acid and a glycol and has hydroxyl groups substantially at both ends.

12. The support of claim 4 wherein said polyester-polyurethane (A) is obtained by chain extending a linear polyester which is the reaction product of a dicarboxylic acid component composed mainly of adipic acid and a glycol component composed mainly of 1,4-butanediol or ethylene glycol with 2,4-tolylene diisocyanate or a mixture of 2,4-tolylene diisocyanate and diphenylmethane diisocyanate.

13. The support of claim 1 wherein said polyfunctional isocyanate (B) is selected from the group consisting of an adduct of trimethylol propane and 2,4-tolylene diisocyanate, an adduct of trimethylol propane and xylylene diisocyanate, condensates of diisocyanates and trimer of 2,4-tolylene diisocyanate.

14. A support for use in preparing a printing plate using a liquid photosensitive resin which includes a mixture of a polymerization initiator activatable by actinic light and a liquid compound having a polymerizable or cross-linkable ethylenic carbon-to-carbon double bond, said support consisting essentially of a flexible self-supporting base plate and an adhesive layer thereof for adhering a layer of said photosensitive resin, said adhesive layer being a layer of a cross-linked polyester-polyurethane resin which is the reaction product of (A) a linear polyester-polyurethane resin obtained by reacting a linear hydroxyl-terminated bifunctional polyester resin with a bifunctional isocyanate compound with (B) a polyfunctional isocyanate on the surface of said plate with component (C) which is a non-gaseous compound having a boiling point higher than 100°C and containing a photopolymerizable double bond, the reaction between (A) and (B) being carried out until isocyanate groups disappear.

15. The support of claim 14 wherein said component (C) is selected from the group consisting of acrylic acid esters, methacrylic acid esters, styrene, substituted styrene, vinyl esters, amide compounds polyfunctional acrylic acid esters, polyfunctional methacrylic acid esters and allyl compounds.

16. The support of claim 14 wherein said component (C) contains two or more ethylenic carbon-to-carbon double bonds.

* * * * *